United States Patent
Hunter

[11] 3,986,052
[45] Oct. 12, 1976

[54] POWER SWITCHING CONTROL CIRCUIT WITH ENHANCED TURN-OFF DRIVE

[75] Inventor: Patrick L. Hunter, Franklin County, Ohio

[73] Assignee: North Electric Company, Galion, Ohio

[22] Filed: May 29, 1975

[21] Appl. No.: 581,913

[52] U.S. Cl. .............................. 307/270; 307/254; 307/300; 307/314
[51] Int. Cl.² ........................................ H03K 17/00
[58] Field of Search ........... 307/270, 353, 354, 300, 307/314

[56] References Cited
UNITED STATES PATENTS

| | | | |
|---|---|---|---|
| 3,131,327 | 4/1964 | Quinn | 307/314 |
| 3,757,144 | 9/1973 | Hetterscheid et al. | 307/300 |
| 3,805,094 | 4/1974 | Orlando | 307/300 |

Primary Examiner—Stanley D. Miller, Jr.
Assistant Examiner—B. P. Davis
Attorney, Agent, or Firm—Charles M. Hutchins

[57] ABSTRACT

A transformer-coupled power switching device control arrangement utilizes an active feedback energy source connected to the primary of the coupling transformer to enhance the turn-off drive to the power switching device. The active feedback energy source produces an output directly dependent upon the magnitude of the power switching device output current and independent of the duration of said output current. When the output current drops to zero, the active feedback source is disabled, and a bias network is connected to the transformer primary. The bias network maintains a reverse voltage at the control electrode of the power switching device and establishes a bias current through the primary suitable for resetting the transformer core flux.

7 Claims, 3 Drawing Figures

POWER SWITCHING CONTROL CIRCUIT WITH ENHANCED TURN-OFF DRIVE

BACKGROUND OF THE INVENTION

1. Field of the Invention

This invention relates generally to control circuits for determining the conductive or non-conductive states of power switching devices. A more particular application of this invention pertains to transformer-coupled base drive control circuits for power switching transistors such as those used in the inverter sections of DC/DC and DC/AC voltage converters.

2. Description of the Prior Art

In converters utilizing transistors as the switching devices in the inverter section, a problem frequently encountered is that of providing an efficient, or hard, turn-off base drive over a wide range of operating conditions. To switch a transistor from the conductive, or saturated state, to a non-conductive, or cut-off state, requires removal of the excess stored base charge in the switching device. Hence, the switching turn-off time is usually a function of both collector current magnitude and duration. The time required to remove the excess base charge is commonly defined as the storage time. At the end of the storage time, the transistor collector current decreases to zero in an interval defined as the fall time.

It is common in regulated coverter circuits for the inverter switching devices to be required to operate at high peak collector currents for very short conduction times. Such a situation occurs, for example, where a substantially short-circuited condition appears at the converter output. Under such a condition, the inverter transistors must supply a peak current, equal to or greater than that current experienced at rated load and output voltage, for very narrow pulse widths. Generally, the commonly used transformer-coupled base drive arrangements of the prior art cannot provide the necessary reverse base current and voltage for efficient turn-off under such very short conduction time operating conditions. Hence, switching losses increase significantly, and the transformer-coupled turn-off control circuitry loses the ability to operate properly at the end of such narrow pulse conduction widths.

The problem may be further explained by noting the general method of operation of transformer-coupled base drive circuits. In prior art circuits, the power transistor turn-off is typically controlled by an arrangement in the transformer primary path providing turn-off potentials which are dependent upon the conduction pulse width of the power transistor. Specifically, turn-off is normally initiated by inducing a reverse current from the transformer primary winding to a secondary winding connected across the base-emitter junction of the power switching device. One such improved circuit for initiating turn-on and turn-off of a power switching device is disclosed in a co-pending application assigned to the same assignee by K. A. Wallace, Ser. No. 581,914 filed May 29, 1975 entitled "Drive Circuit For Power Switching Devices". Wallace discloses means for providing improved turn-off potentials which provide reverse sweep-out current and transformer core flux reset action, and reverse bias for a more stable device non-conduction state.

The amplitude of the reverse base-emitter voltage during the non-conduction interval is determined by the turn-off and transformer core reset circuitry connected to the primary winding. If, as in prior art circuitry, the output impedance of the base drive arrangement is fixed, the circuit's ability to supply reverse turn-off current is reduced in proportion to a reduction in the reverse voltage available at the initiation of turn-off. For long conduction pulse widths, the reverse voltage may be sufficiently large to provide efficient turn-off. However, as the conduction pulse width decreases, the available reverse potential correspondingly decreases. This has been found true even for improved circuits such as that disclosed in the co-pending application by Wallace.

The forward base-emitter voltage and pulse width during conduction determine the positive volt-time integral, or flux change, in the core of the current coupling transformer. To prevent DC magnetization of the transformer core, the negative volt-time integral established during non-conduction must be equal to the positive volt-time integral. Hence, the condition of a narrow forward base-emitter voltage pulse width results in a long turn-off interval, thereby causing a low available reverse voltage at the initiation of turn-off.

SUMMARY OF THE INVENTION

OBJECTS

It is an object of this invention to provide an improved transformer-coupled control arrangement for a power switching device, said arrangement capable of delivering a reverse current sufficiently large to efficiently render the power switching device non-conductive regardless of the device conduction pulse width.

SUMMARY DESCRIPTION

A power switching device conduction state control circuit with enhanced turn-off drive is disclosed. An active feedback voltage source is made dependent on the magnitude of the output current flowing in the power device at the initiation of device turn-off. This low impedance active source provides for efficient reverse drive to the control electrode of the power switching device, said reverse drive being independent of power device conduction pulse width.

The conduction state control circuit includes a first transformer for coupling a control transistor and biasing network connected to its primary winding to the power device control electrode circuit connected to a first secondary winding. The first secondary winding and another secondary winding of the first transformer are mutually poled and connected to provide regenerative feedback from power device output current to the power device control electrode.

The active feedback source is coupled to the power device output circuit to provide a direct relationship between active source output and power device output current.

The combination of the active feedback source and the biasing network comprises a turn-off control circuit for rendering the power switching device non-conductive when connected to the primary winding of the first transformer.

One exemplary embodiment of the invention utilizes a second transformer to provide the coupling between a power switching transistor's collector current and the input to the active feedback source. The active source output is coupled to the primary of the first transformer in a manner suitable for providing a resultant reverse base drive to the power transistor for the duration of the power transistor storage time. At the end of the storage time, the collector current falls to zero, and hence the active feedback source output also goes to zero. The reverse base-emitter voltage during the remaining non-conducting period of the power transistor is determined and furnished by the biasing network connected to the primary of the first transformer.

DRAWING

The objects and features of the invention will become more apparent from a reading of the detailed description taken in conjunction with the drawing in which.

DETAILED DESCRIPTION

Figure 1:
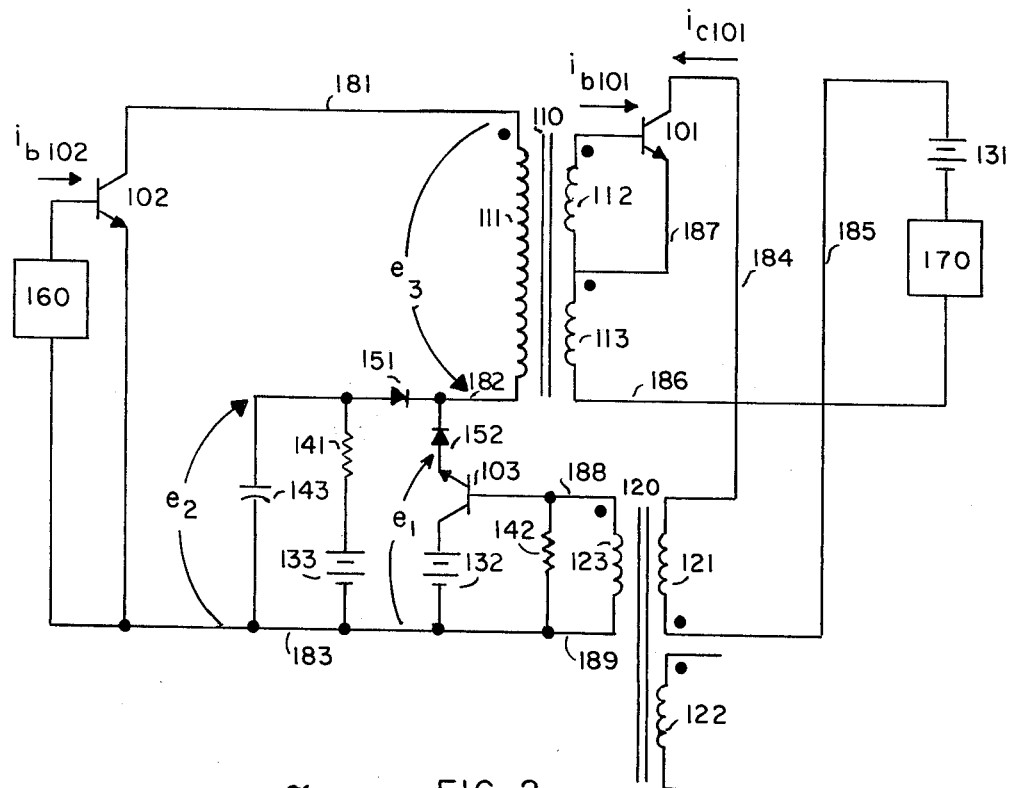
FIG. 1 depicts a functional and schematic diagram of transformer-coupled conduction state control circuitry for a power switching transistor, suitable for use in accordance with the principles of the invention.

As shown in FIG. 1, the power switching device to be controlled is, for the illustrative embodiment, transistor 101. State control signals are coupled to the base of transistor 101 via transformer 110. Coupling from the collector circuit of transistor 101 to an active feedback source is provided by transformer 120.

The output current carried by transistor 101 in the conduction state flows from the emitter electrode of transistor 101, via path 187 through secondary winding 113 of transformer 110, via path 186 through the serial connection of a suitable load circuit 170 and energy source 131, over path 185 through the primary winding 121 of transformer 120, and via path 184 to the collector electrode of transistor 101. Secondary winding 112 of transformer 110 is connected between the base and emitter electrodes of transistor 101.

Also as shown in FIG. 1, primary winding 111 of transformer 110 has its upper terminal connected via path 181 to the collector electrode of control transistor 102. Transistor 102 is driven into and out of saturation by control generator 160, which is connected between the base and emitter electrodes of transistor 102. The other terminal of primary winding 111 is connected via path 182 to a junction point of the cathode electrodes of diodes 151 and 152.

Secondary winding 123 of transformer 120 is connected, via paths 188 and 189, across resistor 142. The junction point comprising the upper terminals of winding 123 and resistor 142 is also connected to the base electrode of transistor 103.

Transistor 103 and energy source 132 comprise an active feedback voltage source. The term active source, as used in this specification, refers to the fact that the source output is made variable by means of the collector-emitter impedance of an active device such as transistor 103. This impedance value is determined by the base drive presented to transistor 103. As shown in FIG. 1, the emitter electrode of transistor 103 is connected to the anode electrode of diode 152, while the collector electrode of transistor 103 is connected to a positive terminal of energy source 132.

The series connection of resistor 141 and energy source 133, in parallel with capacitor 143, comprise a biasing network. As shown in FIG. 1, the junction point comprising the upper terminals of resistor 141 and capacitor 143 is connected to the anode electrode of diode 151. The lower terminal of resistor 141 is connected to a positive terminal of energy source 133. This biasing network is of a type set forth in the previously referenced Wallace co-pending application.

Junction point 183 comprises the common connection of the lower terminal of control generator 160, the emitter electrode of transistor 102, the lower terminal of capacitor 143, a negative terminal of energy source 133, a negative terminal of energy source 132, and the lower terminals of resistor 142 and winding 123.

A second primary winding 122 of transformer 120 could, for example, be connected to a switchable energy source (not shown) suitable for periodically resetting the core flux of transformer 120 to prevent DC magnetization therein. Another exemplary use of a winding such as 122 is set forth in conjunction with the converter circuit of FIG. 3 in a later section of the specification.

The operation of the circuit of FIG. 1 will now be described in conjunction with the waveforms presented in FIG. 2. During the non-conducting interval where transistor 101 is off, control transistor 102 is in a saturated condition due to positive base drive current, $i_{b102}$, shown in FIG. 1 and in FIG. 2. The voltage across capacitor 143, shown in FIG. 1 and FIG. 2 as $e_2$, is positive at the arrowhead. Since transistor 102 is saturated, $e_2$ is applied to the undotted terminal of winding 111 to provide across winding 111 a positive voltage, shown in FIG. 1 and FIG. 2 as $e_3$. Primary current flows through diode 151, winding 111, and the collector-emitter terminals of transistor 102 due to the small positive voltage, $e_2$, across capacitor 143. This current provides magnetizing current to reset the core flux in transformer 110 and provides a negative base-to-emitter voltage for transistor 101 to stably maintain transistor 101 non-conducting.

To initiate conduction through transistor 101, control generator 160 removes base drive from transistor 102 forcing transistor 102 to the off, or high impedance, state. This desired conduction interval is shown as $\tau_N$ at the waveform for $i_{b102}$ in FIG. 2. At the initiation of this interval, the energy stored in the magnetic field of transformer 110 forces the voltage $e_3$ to reverse polarity as shown in FIG. 2. This polarity reversal results in forward base drive, $i_{b101}$ shown in FIG. 1 and FIG. 2. Hence, collector-emitter current of transistor 101, shown as $i_{c101}$ in FIG. 1 and FIG. 2, builds up rapidly in a regenerative manner due to emitter current flow through winding 113 coupled according to the well-known dot convention into winding 112. Transistor 101 is forced to remain in the saturation state due to this coupling between winding 113 and 112.

Figure 2:
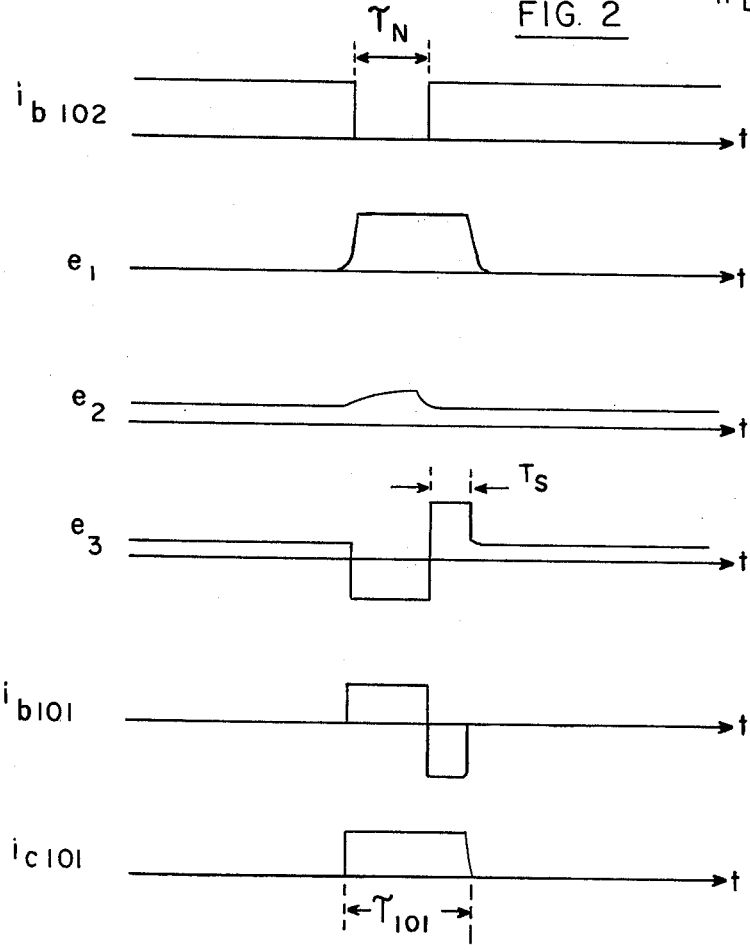
FIG. 2 depicts idealized time-dependent current and voltage waveforms for designated locations in the circuitry of FIG. 1.

Also during the conduction interval, defined in FIG. 2 as $\tau_N$, charge to capacitor 143 is replenished by current flow from energy source 133 through resistor 141. Additionally, during $\tau_N$, $i_{c101}$ flows into the dotted terminal of primary winding 121 of transformer 120. Hence, transformer 120 transforms this current into secondary winding 123 such that current flows out of the dotted terminal and through resistor 142 resulting in a potential suitable for providing base drive to transistor 103. In this manner, base drive to transistor 103 is proportional to collector current $i_{c101}$. Transistor 103 is connected in an emitter-follower configuration to yield a voltage, shown as $e_1$ in FIG. 1 and FIG. 2, which is proportional to the instantaneous value of $i_{c101}$.

At the end of the interval $\tau_N$, when turn-off of transistor 101 is desired, base drive $i_{b102}$ is reapplied to tansistor 102 by control generator 160. Transistor 102 now becomes saturated.

For small pulse widths, $\tau_N$, the voltage $e_2$ will be small compared to the voltage $e_1$ developed by the active feedback source. Hence, diode 151 will be reverse biased and $e_3$ becomes positive, as shown in FIG. 2, due to current flow from the emitter of transistor 103, through diode 152, through primary winding 111, and the collector-emitter terminals of transistor 102. This current flow results in a large transformer-coupled reverse current flow in the base of transistor 101 to provide a hard turn-off drive, as shown by the negative pulse at the waveform for $i_{b101}$ in FIG. 2. The active feedback source, with output corresponding to $e_1$ of FIG. 1 and FIG. 2, remains positive to furnish the reverse base drive as long as collector current $i_{c101}$ continues to flow. This time interval is the storage time for transistor 101, shown as $T_s$ at the $e_3$ waveform of FIG. 2.

When collector current, $i_{c101}$, reaches zero, the large voltage $e_1$ is removed from winding 111 due to the turn-off of transistor 103. At this point, the voltage $e_3$ assumes a small positive value due to current flow from the bias network through diode 151 and winding 111, back through conducting transistor 102. The circuit of FIG. 1 has now passed through a full cycle of operation according to the conduction state of control transistor 102. As seen from FIG. 2 at the waveform for $i_{c101}$, the total conduction time for transistor 101 is $\tau_{101}$, which is approximately equal to the sum of $\tau_N$ and $T_s$.

Figure 3:
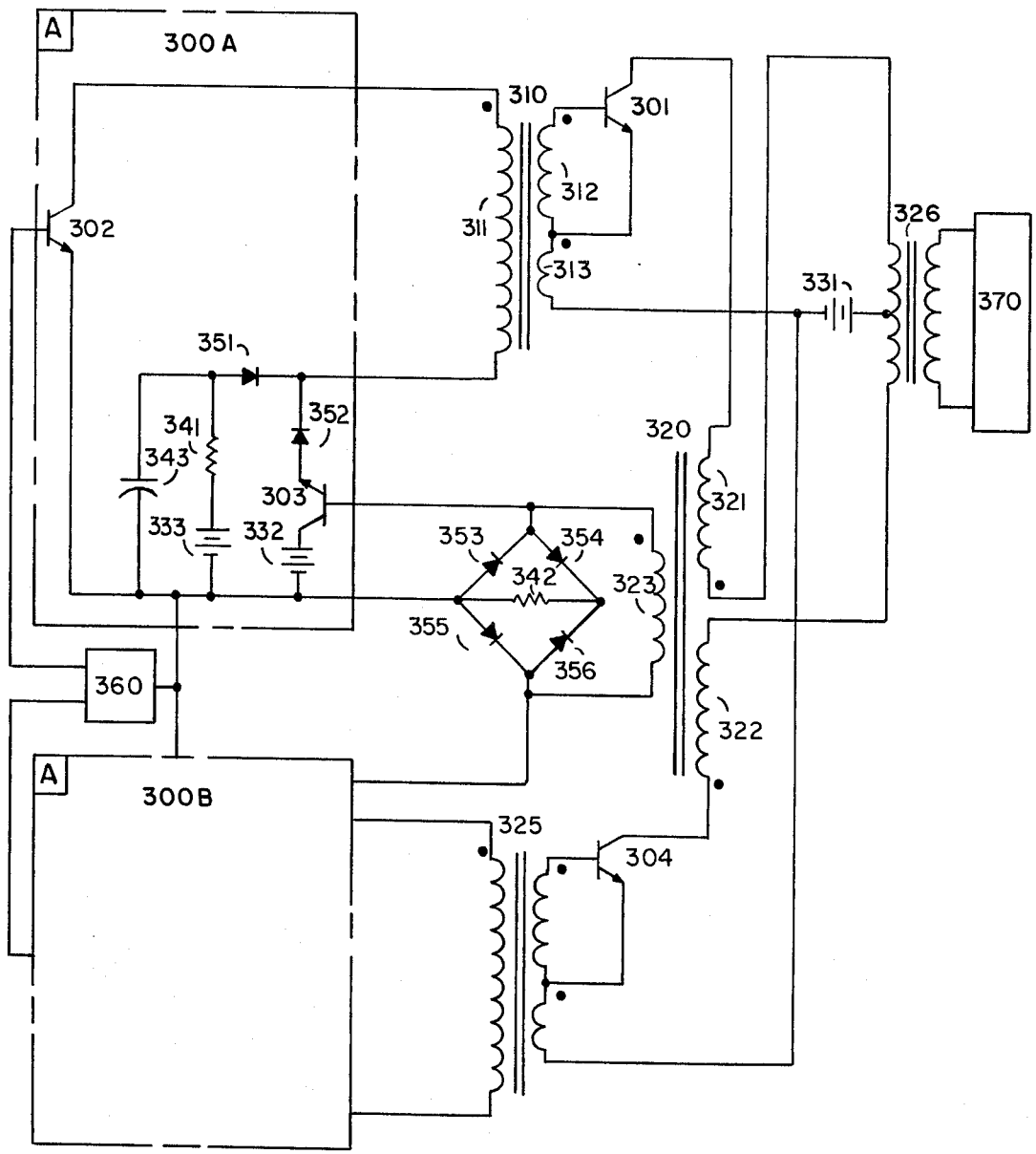
FIG. 3 depicts a functional diagram of an exemplary application of the circuitry of FIG. 1 in a voltage converter circuit wherein the conduction state control circuitry of FIG. 1 is used for both power switching transistors of the inverter section of the voltage converter.

The control arrangement of FIG. 1 lends itself quite well to DC voltage converter applications wherein two inverter section power switching devices are alternately driven into conduction during the course of converter operation. One such converter, using switching control circuits patterned after that of FIG. 1, is shown in FIG. 3.

Inverter transistors 301 and 304 are alternately driven to saturation by their respective control circuits, 300A and 300B. The components and interconnections in 300B are identical to the arrangement shown within the broken lines of 300A. The components shown within 300A, correspond to control elements described in conjunction with FIG. 1, and the operation of 300A and 300B is substantially identical to that of the arrangement of FIG. 1. Note that the last two digits in the identifying numbers for the components of 300A are identical to their counterparts in FIG. 1. For example, capacitor 343 of FIG. 3 corresponds to capacitor 143 of FIG. 1.

To isolate the control circuit of 300A from that of 300B, the base drive for their respective active feedback sources is derived from the resistor 342 which is connected to a full wave rectifier diode bridge comprising diodes 353, 354, 355, and 356.

Pulse width control generator 360 has two outputs, one for driving control transistor 302 of 300A, and the other for driving a corresponding control transistor in 300B. Hence, the outputs of control generator 360 are phased to provide complementary state control to 300A and 300B, resulting in alternate switching of inverter transistor 301 via transformer 310 and inverter transistor 304 via transformer 325. This switching for each inverter transistor is identical to that described in conjunction with FIG. 1.

Feedback transformer 320 has a primary winding 321 for coupling the collector current of transistor 301 to the full wave rectifier connected across secondary winding 323. Likewise, primary winding 322 of transformer 320 is used for coupling the collector current of transistor 304 to the full wave rectifier connected across the secondary winding 323. It should be noted that windings 321 and 322 are poled such that currents through each in alternate inverter cycles are of opposite polarities thereby providing automatic flux reset action to the core of transformer 320. This arrangement therefore prevents DC magnetization of transformer 320.

Other converter elements, well known to those of ordinary skill in the art, are also set out in FIG. 3. Energy source 331 is the DC voltage input to the converter and provides the source for the inverter current flowing in output transformer 326, which couples the inverter output to a suitable load 370.

The descriptions set out hereinabove are solely for the sake of example and are not to be construed as limiting the invention. The invention is to be limited only by the scope and spirit of the appended claims.

What is claimed is:

1. A circuit for controlling the conduction state of a power switching device delivering power to a load means, said device including a control electrode and first and second output electrodes, said load means having a first and second terminal, said first terminal being coupled to said first output electrode, said control circuit comprising;
   transformer means including a primary winding, a first secondary winding connected between said control electrode and said second output electrode, a second secondary winding connected between said second output electrode and said second terminal of said load means, said first and second secondary windings mutually poled to provide regenerative current coupling therebetween,
   device turn-off control means,
   current sensing means for proportionately coupling the current flowing in said load means to an input of said device turn-off control means, and
   control switch means, operative in a first switching state to couple said device turn-off control means to said primary winding, thereby enabling said device turn-off control means, in conjunction with said transformer means, to render said power switching device non-conductive, said control switch means further operative in a second switching state to render, in conjunction with said transformer means, said power switching device conductive by substantially isolating said device turn-off control means from said primary winding.

2. A control circuit as set forth in claim 1, wherein said device turn-off control means comprises;
   an active energy source for producing, during a first predetermined portion of said first switching state, a first output signal directly proportional to the current coupled by said current sensing means to said input of said device turn-off control means,
   biasing means for generating, during a second predetermined portion of said first switching state, a second output signal, first and second means for respectively coupling said first and second output signals to said primary winding.

3. A control circuit as set forth in claim 2, wherein said biasing means comprises capacitance means connected across the serial combination of a bias resistance means and a bias energy source means, said second output signal corresponding to the potential across said capacitance means.

4. A control circuit as set forth in claim 2, wherein said active energy source comprises;
a transistor having a base electrode corresponding to said input of said device turn-off control means, a collector electrode coupled to DC energy source means, and an emitter electrode coupled to said first means for coupling said first output signal to said primary winding.

5. A control circuit as set forth in claim 1, wherein said current sensing means comprises;
current transformer means having at least a primary winding connected in series with said first output electrode and said first terminal of said load means, a secondary winding connected across means for developing a potential related to the current flowing in said secondary winding, and means for coupling said means for developing to said input of said device turn-off control means.

6. A control circuit as set forth in claim 1, wherein said power switching device comprises;
a transistor having a base electrode corresponding to said control electrode, a collector electrode corresponding to said first output electrode, and an emitter electrode corresponding to said second output electrode.

7. A control circuit as set forth in claim 1, wherein said control switch means comprises;
a transistor having base, emitter, and collector electrodes, said base electrode coupled to means suitable for selectively forcing a low and a high impedance condition between said collector and emitter electrodes,
said low impedance condition corresponding to said first switching state, and said high impedance condition corresponding to said second switching state.

* * * * *